United States Patent
Im

(10) Patent No.: US 10,804,300 B2
(45) Date of Patent: Oct. 13, 2020

(54) COMPLEMENTARY THIN FILM TRANSISTOR DRIVE BACK-PLATE AND MANUFACTURING METHOD THEREOF, DISPLAY PANEL

(71) Applicant: BOE TECHNOLOGY GROUP CO., LTD., Beijing (CN)

(72) Inventor: Jang Soon Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 230 days.

(21) Appl. No.: 14/428,832

(22) PCT Filed: Jun. 30, 2014

(86) PCT No.: PCT/CN2014/081190
§ 371 (c)(1),
(2) Date: Mar. 17, 2015

(87) PCT Pub. No.: WO2015/096441
PCT Pub. Date: Jul. 2, 2015

(65) Prior Publication Data
US 2016/0013212 A1 Jan. 14, 2016

(30) Foreign Application Priority Data
Dec. 27, 2013 (CN) .......................... 2013 1 0742725

(51) Int. Cl.
*H01L 27/12* (2006.01)
*H01L 23/00* (2006.01)

(52) U.S. Cl.
CPC ............ *H01L 27/127* (2013.01); *H01L 24/05* (2013.01); *H01L 27/1225* (2013.01); *H01L 27/1251* (2013.01)

(58) Field of Classification Search
CPC ................. H01L 27/1255; H01L 27/1251
See application file for complete search history.

(56) References Cited

U.S. PATENT DOCUMENTS 7,342,245 B2 3/2008 Tanabe
8,455,876 B2 6/2013 Choi et al.
(Continued)

FOREIGN PATENT DOCUMENTS

| CN | 1708860 A | 12/2005 |
| CN | 101064345 A | 10/2007 |
| CN | 101997025 A | 3/2011 |
| CN | 103715147 A | 4/2014 |
| WO | 2013/183495 A1 | 12/2013 |

OTHER PUBLICATIONS

International Search Report with Notice of Transmittal of the International Search Report of PCT/CN2014/081190 in Chinese, dated Oct. 10, 2014.
(Continued)

*Primary Examiner* — Samuel A Gebremariam
*Assistant Examiner* — Jonas T Beardsley
(74) *Attorney, Agent, or Firm* — Collard & Roe, P.C.

(57) ABSTRACT

A complementary thin film transistor drive back-plate and manufacturing method thereof, a display panel. The method comprises: providing a lower semiconductor layer on a base substrate (101), and forming a P-type semiconductor active layer (103); providing a gate insulating layer (107) on the lower semiconductor layer; providing a lower electrode layer on the gate insulating layer (107), and forming a P-type transistor gate electrode (108), an N-type transistor source electrode (109) and an N-type transistor drain electrode (110); providing an upper semiconductor layer on the lower electrode layer, and forming a pixel electrode (111) and an N-type semiconductor active layer (112); providing an isolation insulating protective layer (113) on the upper semiconductor layer, and forming contact holes (114) and a protection unit (115); providing an upper electrode layer on the isolation insulating protective layer (113), and aiming a P-type transistor source electrode (116), a P-type transistor drain electrode (117) and an N-type transistor gate electrode
(Continued)

(118); and providing a pixel defining layer (119) on the upper electrode layer, and forming a pixel connection opening (120).

6 Claims, 9 Drawing Sheets

(56) References Cited

U.S. PATENT DOCUMENTS

| | | | |
|---|---|---|---|
| 2006/0220542 A1* | 10/2006 | Suh | G02F 1/136286 |
| | | | 313/506 |
| 2007/0252207 A1 | 11/2007 | Park et al. | |
| 2011/0049523 A1 | 3/2011 | Choi et al. | |
| 2013/0207087 A1* | 8/2013 | Kim | H01L 27/3225 |
| | | | 257/40 |
| 2015/0123084 A1* | 5/2015 | Kim | H01L 27/326 |
| | | | 257/40 |

OTHER PUBLICATIONS

Written Opinion of the International Searching Authority of PCT/CN2014/081190 in Chinese with English translation dated Oct. 10, 2014.

Chinese Office Action of Chinese Application No. 201310742725.3, dated Sep. 24, 2015 with English translation.

* cited by examiner

COMPLEMENTARY THIN FILM TRANSISTOR DRIVE BACK-PLATE AND MANUFACTURING METHOD THEREOF, DISPLAY PANEL

CROSS REFERENCE TO RELATED APPLICATIONS

This application is the National Stage of PCT/CN2014/081190 filed on Jun. 30, 2014, which claims priority under 35 U.S.C. § 119 of Chinese Application No. 201310742725.3 filed on Dec. 27, 2013, the disclosure of which is incorporated by reference.

TECHNICAL FIELD

Embodiments of the present invention relate to a complementary thin film transistor drive back-plate and a manufacturing method thereof, a display panel.

BACKGROUND

With the improvement of people's living standards, liquid crystal displays (LCDs) have become very common, and the LCDs appear in cell phones, cameras, computers, televisions and so on. The great demand for display products of the people pushes forward the development of display technology objectively, so that new display technologies, such as low temperature polycrystalline silicon, organic display technology and so on, continually emerge. An active matrix organic light emitting diode panel (AMOLED) is called as the next generation of the display technology, and companies including Samsung Electronics, LG, and Philips place great importance onto this new display technology. Currently, in addition to Samsung Electronics, LG and Philips that focus mainly on large-scale active matrix organic light emitting diode panel products, medium/small-scale products is the developing direction of Samsung SDI, AU Optronics, etc. The reason is that an active matrix organic light emitting diode panel is far superior to a TFT-LCD theoretically no matter in quality, efficiency or cost.

An active matrix organic light emitting diode panel, such as a complementary thin film transistor drive back-plate for driving a panel to display images, is provided, and its manufacturing process mainly comprises a plurality of patterning processes, such as eleven masking/photolithography processes and three doping processes, and patterns required by devices (e.g., a thin film transistor, etc.) is formed on each thin film layer.

SUMMARY

According to an embodiment of the present invention, there are provided a complementary thin film transistor drive back-plate and the manufacturing method thereof, a display panel, so as to simplify the fabricating steps and to save the fabricating cost.

According to an embodiment of the invention, there is provided a manufacturing method of a complementary thin film transistor drive back-plate, comprising the following steps: providing a lower semiconductor layer on a base substrate, the lower semiconductor layer including a P-type semiconductor active layer; providing a gate insulating layer on the lower semiconductor layer; providing a lower electrode layer on the gate insulating layer, the lower electrode layer including a P-type transistor gate electrode, an N-type transistor source electrode and an N-type transistor drain electrode, the P-type transistor gate electrode lying over the P-type semiconductor active layer; providing an upper semiconductor layer on the lower electrode layer with an oxide semiconductor material, the upper semiconductor layer including a pixel electrode and an N-type semiconductor active layer, two ends of the N-type semiconductor active layer overlapping and contacting the N-type transistor source electrode and the N-type transistor drain electrode, respectively; conducting a plasma treatment on the oxide semiconductor material corresponding to the region of the pixel electrode; providing an isolation insulating protective layer on the upper semiconductor layer, the isolation insulating protective layer including contact holes and a protection unit, the contact holes lying at two ends of the P-type semiconductor active layer and a region corresponding to the pixel electrode; providing an upper electrode layer on the isolation insulating protective layer, the upper electrode layer including a P-type transistor source electrode, a P-type transistor drain electrode and an N-type transistor gate electrode, the P-type transistor source electrode and the P-type transistor drain electrode being connected to two ends of the P-type semiconductor active layer through the contact holes, respectively, the N-type transistor gate electrode lying over the N-type semiconductor active layer; and providing a pixel defining layer on the upper electrode layer, the pixel defining layer including a pixel connection opening.

According to another embodiment of the invention, there is provided a complementary thin film transistor drive back-plate, comprising a base substrate and, a lower semiconductor layer including a P-type semiconductor active layer; a gate insulating layer; a lower electrode layer including a P-type transistor gate electrode, an N-type transistor source electrode and an N-type transistor drain electrode; an upper semiconductor layer including a pixel electrode and an N-type semiconductor active layer; an isolation insulating protective layer including contact holes and protection units; an upper electrode layer including a P-type transistor source electrode, a P-type transistor drain electrode and a plurality of N-type transistor gate electrodes; and a pixel defining layer including a pixel connection opening, which are provided on the base substrate, sequentially.

According to still another embodiment of the invention, there is provided a display panel, comprising the above complementary thin film transistor drive back-plate.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

As noticed by inventors, in terms of manufacture of a complementary thin film transistor drive back-plate, it is expected by people to reduce the number of patterning process, simplify fabricating steps, and to comply with the developing requirements on lighter and thinner active matrix organic light emitting diode panels to reasonably reduce its thickness.

First Embodiment

According to an embodiment of the invention, there is provided a manufacturing method of a complementary thin film transistor drive back-plate, which comprises the following steps.

Figure 1:
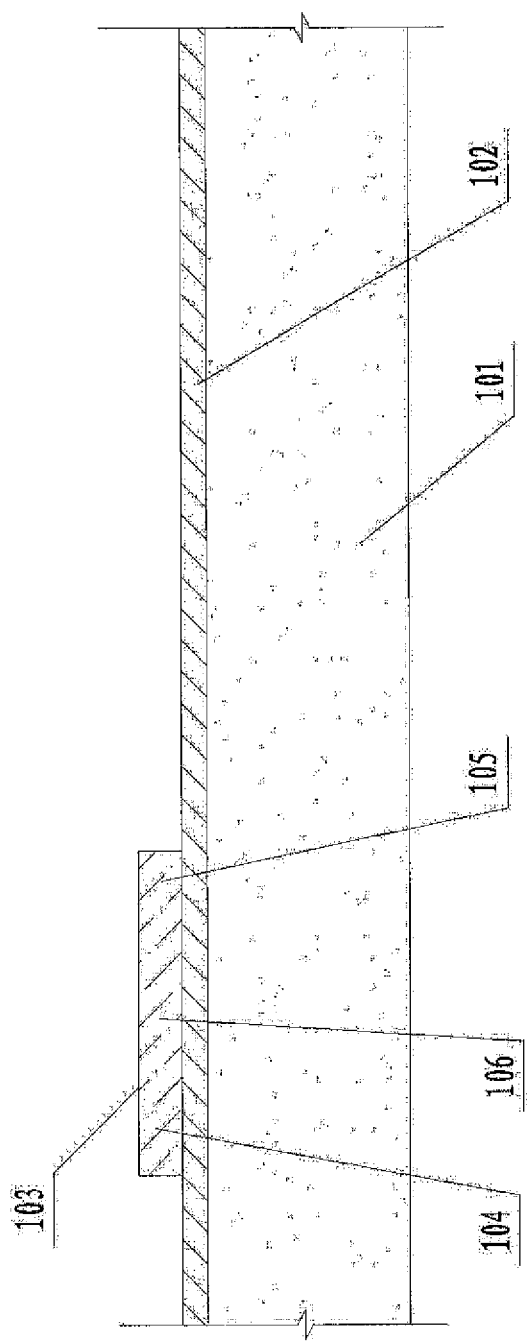
FIG. 1 to FIG. 8 are schematic views illustrating steps of a manufacturing method according to an embodiment of the invention.

1. As shown in FIG. 1, after a base substrate 101 is subjected to a cleaning treatment, a lower semiconductor layer is provided on the base substrate 101.

In an example, a buffer layer 102 is provided on the base substrate 101 by, such as, plasma enhanced chemical vapor deposition method (PECVD). The base substrate 101 may be of a transparent material possessing a good transmittance, such as, glass, hard transparent plastic, etc.; and the buffer layer 102 comprises a silicon oxide structural layer and a silicon nitride structural layer disposed sequentially, or comprises a composite layer of a silicon oxide structural layer and a silicon nitride structural layer. In an example, the thickness of the silicon oxide structural layer is in the range of 50 nm to 100 nm, and the thickness of the silicon nitride structural layer is in the range of 100 nm to 300 nm.

A lower semiconductor layer is provided on the buffer layer 102. In an example, an amorphous silicon thin film is provided on the buffer layer 102 by, such as, plasma enhanced chemical vapor deposition method. For example, the thickness of the amorphous silicon thin film is in the range of 40 nm to 50 nm. The base substrate 101 is sent into a high-temperature reaction furnace, and a dehydrogenating treatment is conducted on the amorphous silicon thin film so as to reduce the hydrogen content in the amorphous silicon thin film. In general, the content of hydrogen is controlled to be no more than 2%. The amorphous silicon thin film is subjected to such as an excimer laser annealing treatment, so that the amorphous silicon thin film is converted into a polycrystalline silicon thin film, which is the lower semiconductor layer.

A plurality of P-type semiconductor active layers 103 are formed in the lower semiconductor layer by a masking/photolithography process; and a P-type semiconductor active layer 103 comprises a source contact region 104, a drain contact region 105 and an active-layer linkage region 106 disposed between the source contact region 104 and the drain contact region 105. The masking/photolithography process in embodiments of the invention may include photoresist coating, mask provision, exposure, development, etching, photoresist removing and other procedures.

Figure 2A:
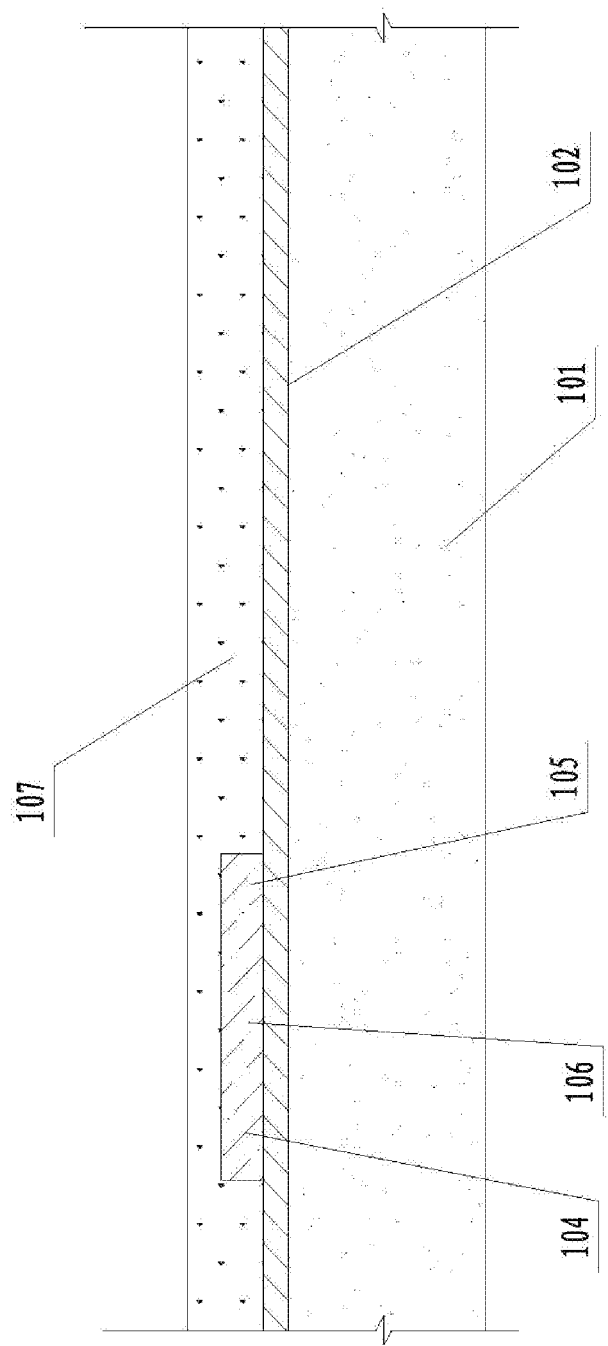
Figure 2B:
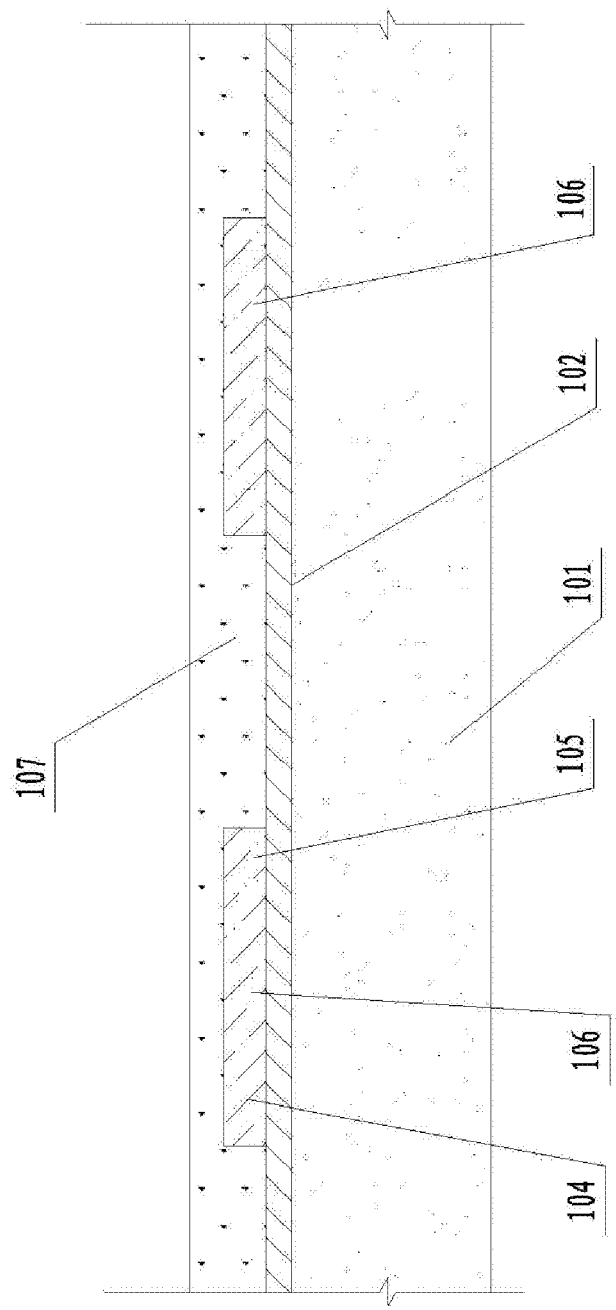

2. As shown in FIG. 2A and FIG. 2B, a gate insulating layer 107 is provided on the lower semiconductor layer.

For example, a gate insulating layer is provided on the lower semiconductor layer by plasma enhanced chemical vapor deposition method. In an example, the gate insulating layer 107 comprises a composite layer of a silicon oxide structural layer and a silicon nitride structural layer, and in another example, the thickness of the silicon oxide structural layer is in the range of 50 nm to 100 nm, and the thickness of the silicon nitride structural layer is in the range of 40 nm to 80 nm. The gate insulating layer 107 acts to separate the P-type semiconductor active layer 103 from a P-type transistor gate electrode, so that an electronic signal crosstalk will not occur between the two components in operation.

Figure 3:
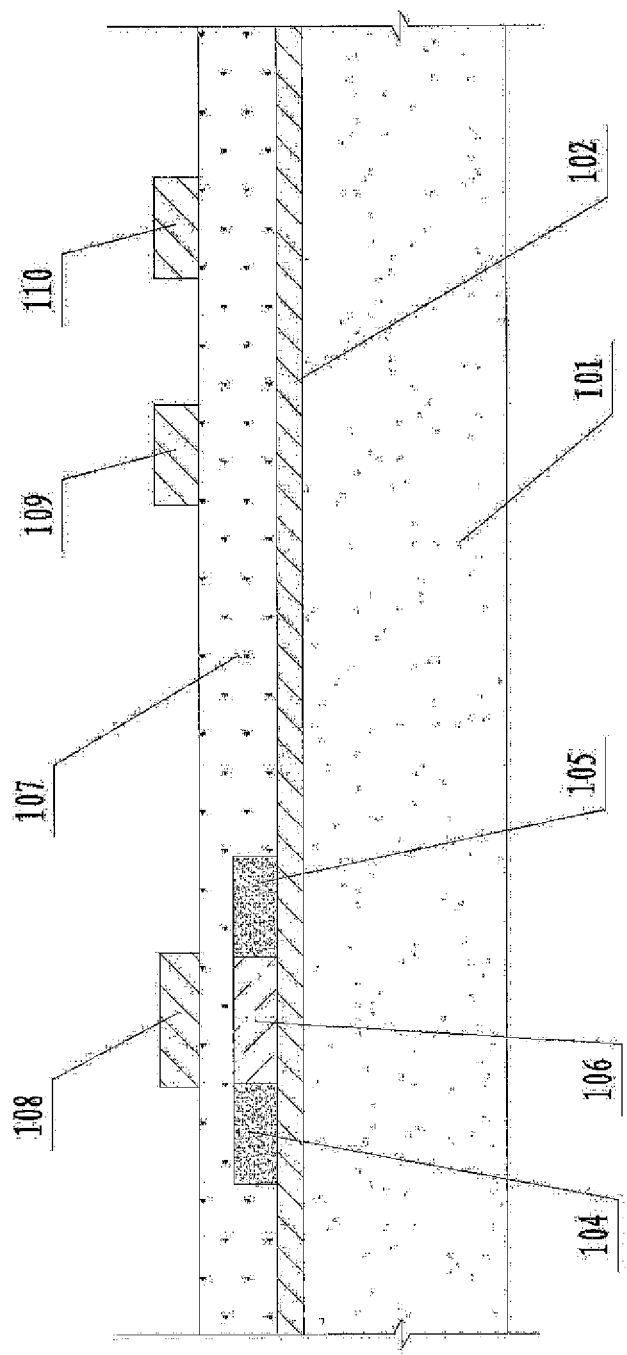

3. As shown in FIG. 3, a lower electrode layer is provided on the gate insulating layer 107 by such as magnetron sputtering process.

A plurality of P-type transistor gate electrodes 108, a plurality of N-type transistor source electrodes 109 and a plurality of N-type transistor drain electrodes 110 are formed on the lower electrode layer through a masking/photolithography process; and the P-type transistor gate electrodes 108 are located over the P-type semiconductor active layers 103. In an example, the lower electrode layer is made of any of metals including molybdenum, tungsten, titanium or chromium.

The P-type semiconductor active layers 103 are doped by, such as, ion implantation process. During the implantation, with P-type transistor gate electrodes 108 over active layer linkage regions 106 as a mask, a self-alignment process is realized. Dopants are implanted into the source contact region 104 and the drain contact region 105, respectively, so as to form a source contact region 104 and a drain contact region 105 with dopants.

Dopants in the source contact region 104 and the drain contact region 105 are highly activated by an activating process, so as to endow the activated dopants in an ionic state with a higher moving ability, and thus they are automatically filled to suitable locations in the source contact region 104 and the drain contact region 105 for repairing lattice defects within them.

Figure 4:
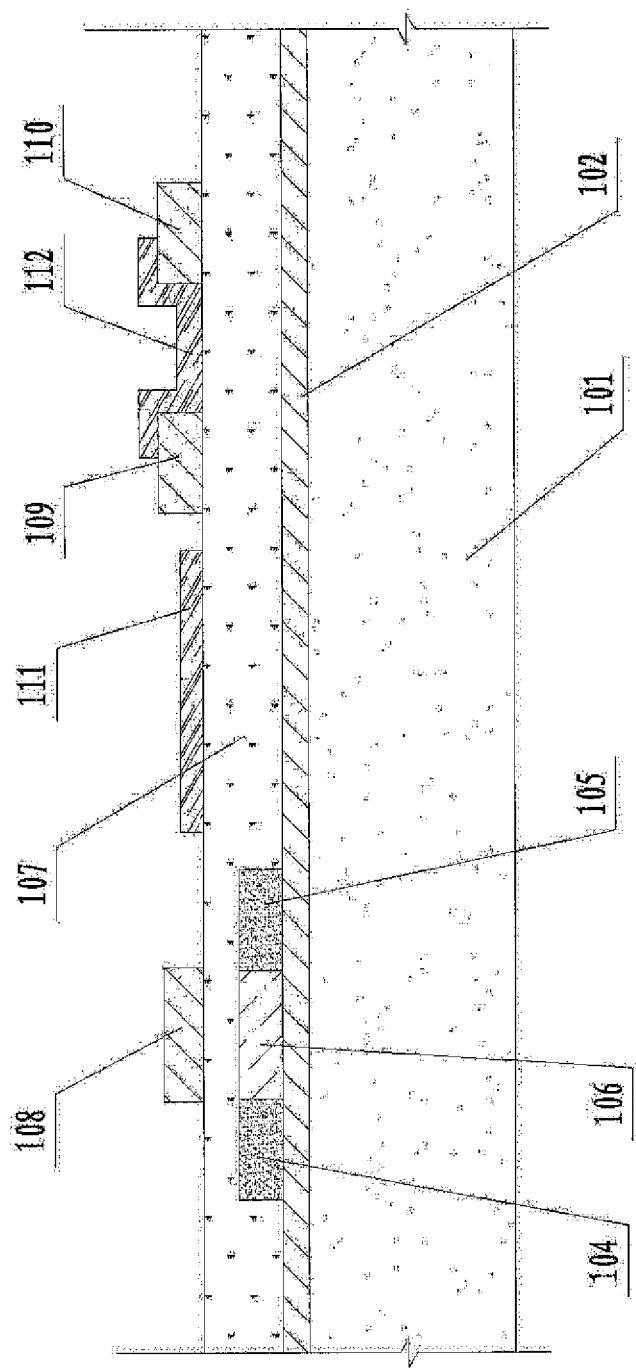

4. As shown in FIG. 4, an upper semiconductor layer is provided above the lower electrode layer by using such as an oxide semiconductor material and by such as magnetron sputtering process.

A pixel electrode 111 and an N-type semiconductor active layer 112 are formed of the upper semiconductor layer by such as patterning process. In an example, two ends of the N-type semiconductor active layer 112 overlap and contact the N-type transistor source electrode 109 and the N-type transistor drain electrode 110, respectively. The oxide semiconductor material corresponding to the pixel electrode 111 region is subjected to, such as, plasma treatment. In an example, the plasma treatment process comprises that, in a vacuum chamber, the oxide semiconductor material corresponding to the pixel electrode 111 region is treated with $O_2$ plasma, $N_2O$ plasma or $N_2$ plasma; the power is in the range of 1500 W to 2500 W, the pressure is in the range of 1000 mtorr to 2000 mtorr, and the gas flow rate is in the range of 5000 sccm to 15000 sccm. With this operation, the carrier density in the oxide semiconductor material can be enhanced so as to increase its conductivity.

The upper semiconductor layer adopts one or more materials selected from the group consisting of indium gallium zinc oxide, zinc oxide, indium zinc oxide, indium tin zinc oxide and other transparent metal oxide semiconductor material.

Figure 5:
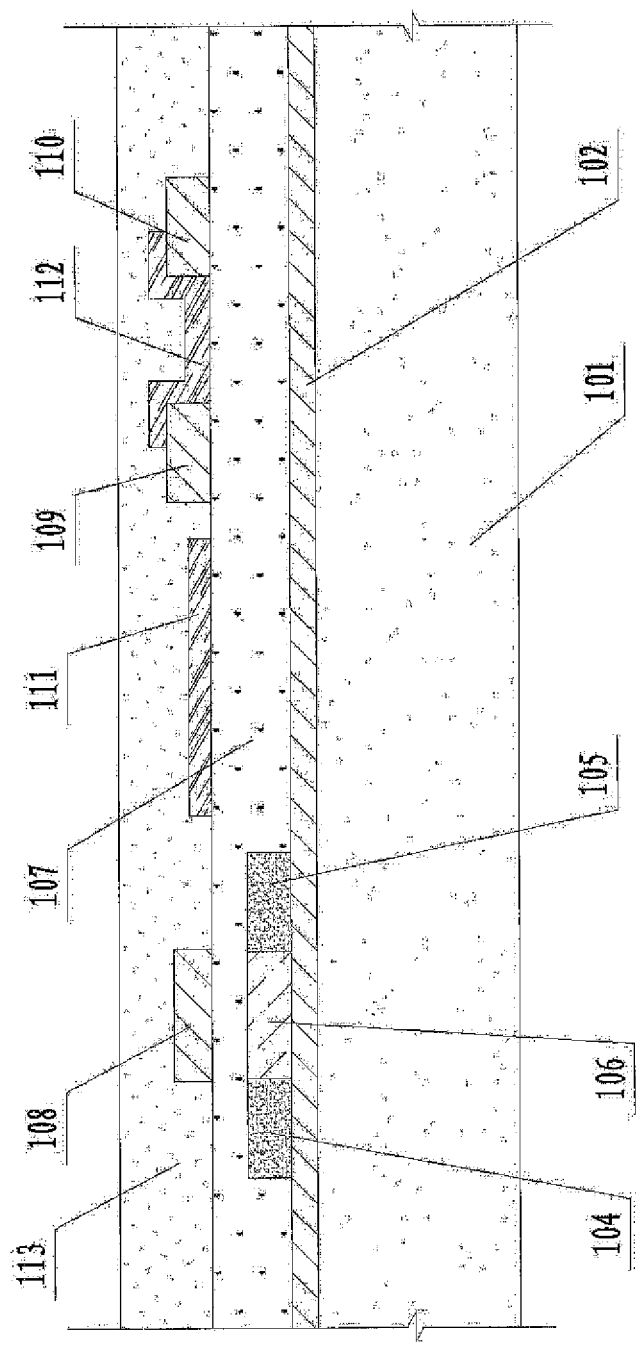

5. As shown in FIG. 5, an isolation insulating protective layer 113 is provided on the upper semiconductor layer by such as plasma enhanced chemical vapor deposition process.

In an example, the isolation insulating protective layer 113 comprises a composite layer of a silicon oxide structural layer and a silicon nitride structural layer.

Figure 6:
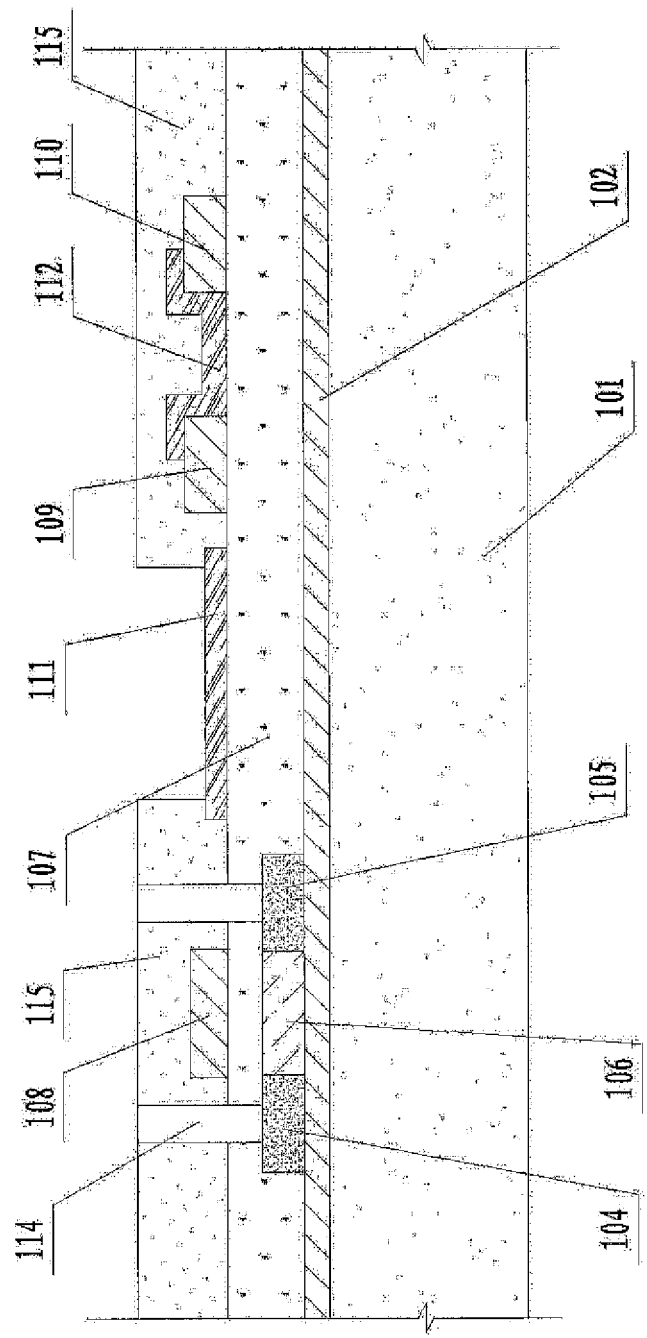

6. As shown in FIG. 6, a protection unit 115 between an N-type transistor gate electrode and an N-type semiconductor active layer 112 and contact holes 114 located at both ends of a P-type semiconductor active layer 103 and in a region corresponding to the pixel electrode 111 are formed from the isolation insulating protective layer 113 by masking/photolithography process. The contact holes 114 penetrate the isolation insulating protective layer 113 up to the source contact region 104 and the drain contact region 105 of the P-type semiconductor active layer 103.

Figure 7:
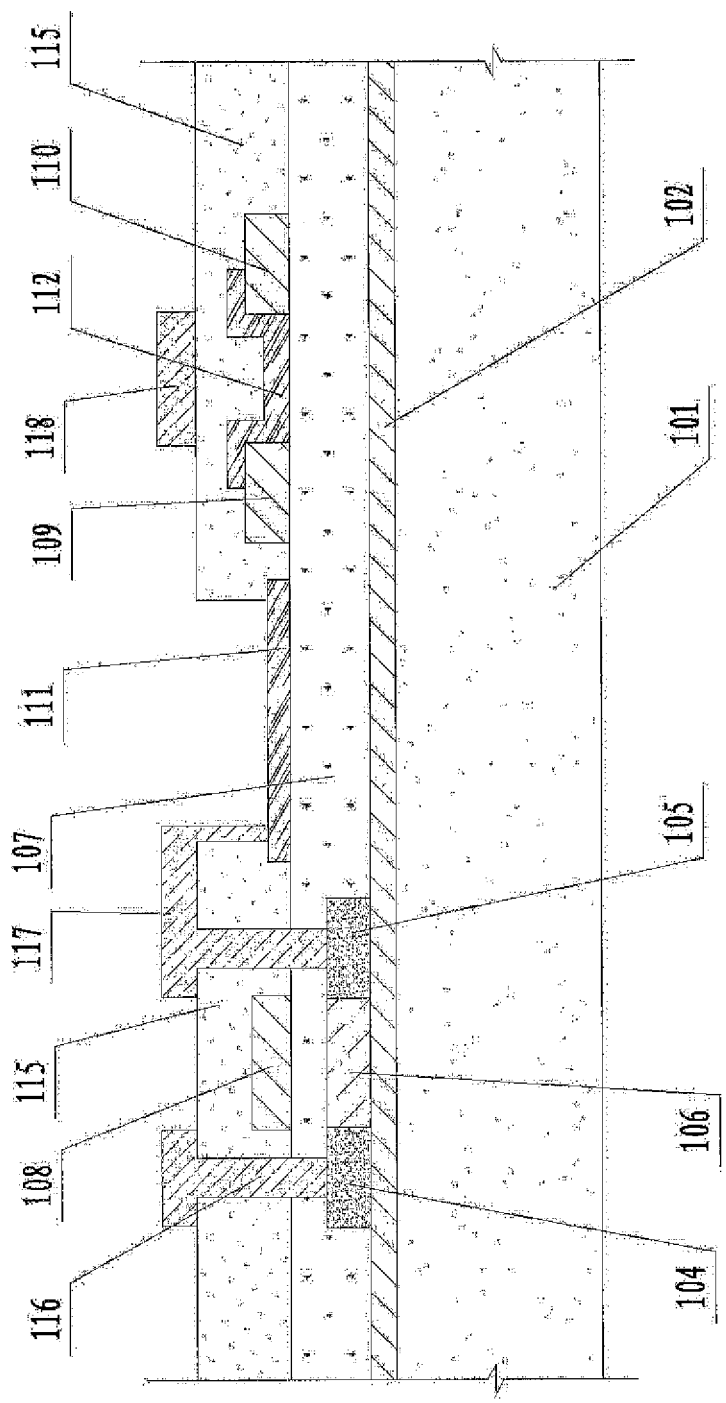

7. As shown in FIG. 7, an upper electrode layer is provided on the isolation insulating protective layer 113 by such as magnetron sputtering process.

In an example, the upper electrode layer is made of any of metals including aluminum, titanium or silver or an alloy consisting of several metals selected from them as desire. A P-type transistor source electrode 116, a P-type transistor drain electrode 117 and an N-type transistor gate electrode 118 are formed on the upper electrode layer by masking/photolithography process. The P-type transistor source electrode 116 and the P-type transistor drain electrode 117 are connected to ends of a p-type semiconductor active layer 103 through contact holes 114, and the P-type transistor drain electrode 117 is also connected to the pixel electrode 111; the N-type transistor gate electrode 118 is located over the N-type semiconductor active layer 112.

Up to here, the manufacture process of a P-type transistor and an N-type transistor is finished. The P-type transistor comprises the P-type semiconductor active layer 103, the P-type transistor gate electrode 108, the P-type transistor source electrode 116 and the P-type transistor drain electrode 117; and the N-type transistor comprises the N-type semiconductor active layer 112, the N-type transistor gate electrode 118, the N-type transistor source electrode 109 and the N-type transistor drain electrode 110.

Figure 8:
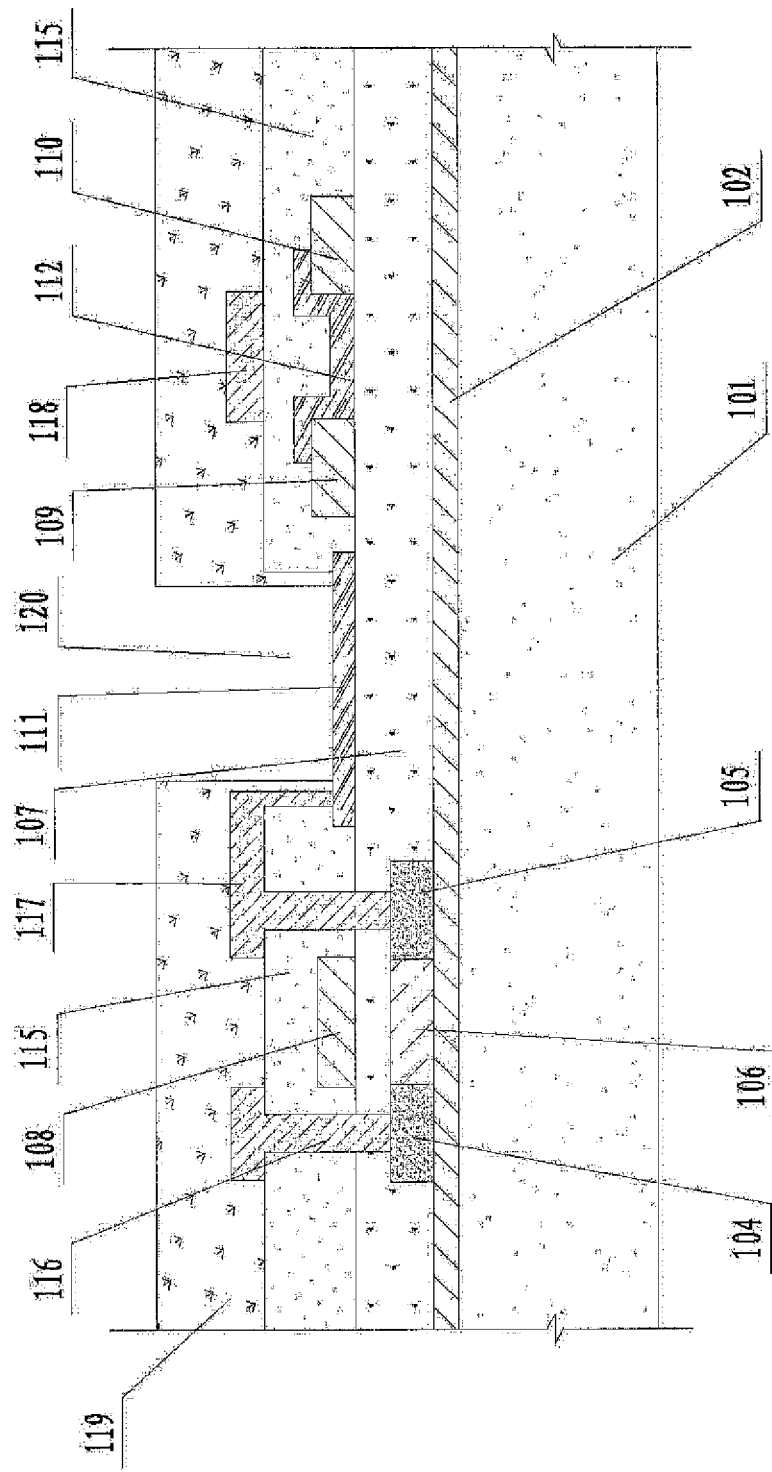

8. As shown in FIG. 8, a pixel defining layer 119 is provided on the upper electrode layer by such as spin-coating process, and a pixel connection opening 120 is formed on the pixel defining layer by such as masking/photolithography process.

The pixel connection opening 120 is disposed on the pixel electrode 11 between two adjacent protection units 115. Up to here, the manufacture of the complementary thin film transistor drive back-plate is finished. The pixel connection opening 120 is used for the corresponding connection between an organic light emitting layer in an organic electroluminescent substrate and the pixel electrode, so as to achieve the luminous drive of the organic electroluminescent substrate by the complementary thin film transistor drive back-plate. The pixel electrode in the embodiment is just part of an anode layer in the organic electroluminescent substrate.

In the manufacturing method according to the embodiment, by a step of forming the P-type transistor gate electrode 108, the N-type transistor source electrode 109 and the N-type transistor drain electrode 110 of the same metallic substance on the same lower electrode layer at one time and a step of forming the pixel electrode 111 and the N-type semiconductor active layer 112 on the same upper semiconductor layer in the same process, an N-type transistor source electrode and a source contact region, the material of which is a semiconductor material, are integrated into one N-type transistor source electrode of a metallic substance, and accordingly, an N-type transistor drain electrode and a drain contact region, the material of which is a semiconductor material, are integrated into one N-type transistor drain electrode of a metallic substance. In the manufacturing method according to the embodiment, the N-type transistor source electrode 109 and the N-type transistor drain electrode 110 are connected by using an N-type semiconductor active layer 112, replacing an active-layer linkage region of an N-type transistor; in this way, a step of doping a source contact region of an N-type transistor, a drain contact region of the N-type transistor and an N-type semiconductor active layer can be omitted. Thus, with the manufacturing method according to the embodiment, the process steps are effectively simplified, the fabricating cost is reduced, and the fabricating efficiency is improved.

In the manufacturing method according to the embodiment, contact holes 114 and protection units 115 are formed in the same isolation insulating protective layer 113 in the same process, and the protection units 115 act as an interlayer dielectric layer on the P-type transistor gate electrode 108 and a gate insulating layer for the N-type transistor gate electrode 118, respectively. As such, the interlayer dielectric layer and the gate insulating layer are merged into a single-layer structure and can be formed by one masking/photolithography process, and this reduces the thickness of the complementary thin film transistor drive back-plate. Thus, according to embodiments of the invention, the process steps are simplified, the fabricating cost is reduced, and the fabricating efficiency is improved.

In the manufacturing method according to the embodiment, the P-type transistor source electrode 116, the P-type transistor drain electrode 117 and the N-type transistor gate electrode 118 are formed on the same upper electrode layer, and this makes these three electrodes are formed of the same metallic material. Thereby, a step of forming an N-type transistor gate electrode 118 separately by a masking/photolithography process can be omitted. Thus, according to embodiments of the invention, the process steps are simplified, the fabricating cost is reduced, and the fabricating efficiency is improved.

With the manufacturing method of the embodiment, a complementary thin film transistor drive back-plate can be made by only six masking/photolithography processes. As compared with other manufacturing method, at least five masking/photolithography processes are saved, and the fabricating cost is reduced greatly; and meanwhile, the fabricated complementary thin film transistor drive back-plate become lighter and thinner.

It is to be noted that, no distinction is made between P-type transistor source electrodes and P-type transistor drain electrodes, and correspondingly no distinction is made between N-type transistor source electrodes and N-type transistor drain electrodes, either. For example, a P-type transistor source electrode may also be called as a P-type transistor drain electrode, and accordingly, in this case, a P-type transistor drain electrode may also be called as a P-type transistor source electrode.

Second Embodiment

A complementary thin film transistor drive back-plate in the embodiment is made by the manufacturing method in the first embodiment, and therefore, the technical contents disclosed in the first embodiment will not be described repetitively. Contents disclosed by the first embodiment also belong to the contents disclosed by the present embodiment.

As shown in FIG. 8, according to the embodiment, there is provided a complementary thin film transistor drive back-plate, which is made by, such as the manufacturing method of the complementary thin film transistor drive back-plate stated in the first embodiment.

The complementary thin film transistor drive back-plate in the embodiment comprises a base substrate 101, and on the base substrate 101 and from bottom to top, there are sequentially provided a buffer layer 102; a lower semiconductor layer including a plurality of P-type semiconductor active layers 103; a gate insulating layer 107; a lower electrode layer including a plurality of P-type transistor gate electrodes 108, a plurality of N-type transistor source electrodes 109 and a plurality of N-type transistor drain electrodes 110; an upper semiconductor layer including a plurality of pixel electrodes 111 and a plurality of N-type semiconductor active layers 112; an isolation insulating protective layer 113 including a plurality of contact holes 114 and a plurality of protection units 115; an upper electrode layer including a plurality of P-type transistor source electrodes 116, a plurality of P-type transistor drain electrodes 117 and a plurality of N-type transistor gate electrodes 118; and a pixel defining layer 119 disposed on the upper electrode layer and including a plurality of pixel connection openings 120. A pixel connection opening 120 is arranged between two adjacent protection units 115.

A P-type semiconductor active layer 103 stated in the embodiment comprises a source contact region 104, a drain contact region 105 and an active-layer linkage region 106 disposed between the source contact region 104 and the drain contact region 105; the P-type transistor gate electrodes 108 are disposed over the P-type semiconductor active layers 103 and correspond to locations of active-layer linkage regions 106; the gate insulating layer 107 is disposed between the P-type transistor gate electrodes 108 and the P-type semiconductor active layers 103; on the P-type transistor gate electrodes 108, there are provided the protection units 115, which fully encapsulate the P-type transistor gate electrodes 108; the upper part of a P-type transistor source electrode is arranged on a protection unit 115, and the lower part thereof goes deeply into a contact hole 114 to connect a source contact region 104; the upper part of a P-type transistor drain electrode 117 is arranged on a protection unit 115, and the lower part thereof goes deeply into a contact hole 114 to contact a drain contact region 105; and the pixel defining layer 119 covers the P-type transistor source electrodes 116 and the P-type transistor drain electrodes 117 from the above as a whole, and fully encapsulates the protection units 115 located on the P-type transistor gate electrodes 108.

The pixel electrode 111 stated in the embodiment is disposed on the gate insulating layer 107 between a P-type semiconductor active layer 103 and an N-type semiconductor active layer 112; an N-type transistor source electrode 109 and an N-type transistor drain electrode 110 are connected by an N-type semiconductor active layer 112; an N-type transistor gate electrode 118 is disposed over an N-type semiconductor active layer 112 and corresponds to location of the N-type semiconductor active layer 112; between an N-type transistor gate electrode 118 and an N-type semiconductor active layer 112, there is provided a protection unit 115, which fully encapsulates the N-type semiconductor active layer 112 together with an N-type transistor source electrode 116 and an N-type transistor drain electrode 117; the pixel defining layer 119 covers the N-type transistor gate electrodes 118 from the above as a whole, and fully encapsulates a protection unit 115 located between an N-type transistor gate electrode 118 and an N-type semiconductor active layer 112.

The upper part of a P-type transistor drain electrode 117 stated in the embodiment is connected to a pixel electrode 111. A right end of a protection unit 115 located on a P-type transistor gate electrode 108 in the embodiment is placed on a left end of a pixel electrode; and as for a protection unit 115 located between an N-type transistor gate electrode 118 and an N-type semiconductor active layer 112, the left end of the protection unit is placed on a right end of the pixel electrode. The pixel connection openings 120 in the embodiment penetrate the pixel defining layer 119, and they are arranged on pixel electrodes 111 in correspondence.

The drive back-plate in the embodiment adopts a design of arranging a pixel electrode 111 between two adjacent protection units 115. With this design, the pixel electrode 111 can be reasonably placed in the space between a P-type transistor and an N-type transistor, without changing its own structural characteristics of the complementary thin film transistor drive back-plate. Furthermore, pixel electrodes 111 and P-type semiconductor active layers 103 can be formed simultaneously through the same one masking/photolithography process. As such, the step of forming pixel electrodes 111 separately through a masking/photolithography process is omitted, so that the overall thickness of the complementary thin film transistor drive back-plate can be reduced effectively. Thus, according to the embodiment, the process steps are effectively simplified, the fabricating cost is reduced, and the fabricating efficiency is improved.

Each of the P-type transistor gate electrodes 108, the N-type transistor source electrodes 109 and the N-type transistor drain electrodes 110 as stated in the embodiment is made of any of metals including molybdenum, tungsten, titanium or chromium, or an alloy of several metals selected from them as desire.

Each of the pixel electrodes 111, the N-type transistor source electrodes 109 and the N-type transistor drain electrodes 110 in the embodiment is made of any one selected from the group consisting of an indium gallium zinc oxide, a zinc oxide, a indium zinc oxide, a indium tin zinc oxide and other transparent metal oxide semiconductor material or a composite of several materials selected from them as desire.

Each of the P-type transistor source electrodes 116, the P-type transistor drain electrodes 117 and the N-type transistor gate electrodes 118 in the embodiment is made of any of metals including aluminum, titanium or silver or an alloy consisting of several metals selected from them as desire.

Third Embodiment

A display panel in the embodiment comprises a complementary thin film transistor drive back-plate as stated in the second embodiment, and therefore, technical contents disclosed in the second embodiment will not be described repetitively. Contents disclosed by the second embodiment also belong to contents disclosed by the present embodiment.

A display panel is provided by the present embodiment, and in an example, the display panel is an active matrix organic light emitting diode panel. The display panel comprises a complementary thin film transistor drive back-plate, such as that stated in the second embodiment, and an organic electroluminescent substrate disposed on the complementary thin film transistor drive back-plate. On the organic electroluminescent substrate, for example, there are provided an anode layer, an organic luminous layer and a cathode layer from bottom to top.

In an example, the organic luminous layer is mounted corresponding to a pixel electrode, so as to achieve the luminous drive of the organic electroluminescent substrate by the complementary thin film transistor drive back-plate. The pixel electrode stated in the embodiment is just a part of the anode layer in the organic electroluminescent substrate.

Above embodiments of the invention have the following merits:

1. in embodiments of the invention, the P-type transistor gate electrodes, the N-type transistor source electrodes and the N-type transistor drain electrodes of the same metallic substance are formed by a same lower electrode layer, and the pixel electrodes and the N-type semiconductor active layers are formed by a same upper semiconductor layer. In this way, an N-type transistor source electrode and a source contact region, the material of which is a semiconductor material, are merged into one N-type transistor source electrode of a metallic substance, and accordingly, an N-type transistor drain electrode and a drain contact region, the material of which is a semiconductor material, are merged into one N-type transistor drain electrode of a metallic substance. According to embodiments of the invention, an N-type transistor source electrode and an N-type transistor drain electrode are connected by using an N-type semiconductor active layer, replacing an active-layer linkage region of an N-type transistor. With this structure, a step of doping a source contact region of an N-type transistor, a drain contact region of the N-type transistor and an N-type semiconductor active layer is omitted. Thus, according to embodiments of the invention, the process steps are effectively simplified, the fabricating cost is reduced, and the fabricating efficiency is improved.
2. In embodiments of the invention, contact holes and protection units that act as an interlayer dielectric layer on a P-type transistor gate electrode and a gate insulating layer for the N-type transistor gate electrode, respectively, are formed in the same isolation insulating protective layer. As such, the interlayer dielectric layer and the gate insulating layer are merged into a single layer structure and can be formed by one masking/photolithography process. Thus, according to embodiments of the invention, the thickness of the complementary thin film transistor drive back-plate is reduced; and furthermore, the process steps are simplified, the fabricating cost is reduced, and the fabricating efficiency is improved.
3. In embodiments of the invention, P-type transistor source electrodes, P-type transistor drain electrodes and N-type transistor gate electrodes are formed by a same upper electrode layer, and this makes these three layer formed of a same metallic material. Thereby, a step of forming N-type transistor gate electrodes separately by a masking/photolithography process can be omitted. Thus, according to embodiments of the invention, the process steps are simplified, the fabricating cost is reduced, and the fabricating efficiency is improved.
4. Embodiments of the invention adopt a design of arranging a pixel electrode between two adjacent protection units. With this design, the pixel electrode is placed in the space between a P-type transistor and an N-type transistor, without changing its own structural characteristics of the complementary thin film transistor drive back-plate. Furthermore, pixel electrodes and P-type semiconductor active layers are formed simultaneously through one masking/photolithography process. As such, a step of forming pixel electrodes separately through a masking/photolithography process is omitted, and the overall thickness of the complementary thin film transistor drive back-plate can be reduced effectively. Thus, according to embodiments of the invention, the process steps are effectively simplified, the fabricating cost is reduced, and the fabricating efficiency is improved.

This application claims the benefit of priority from Chinese patent application No. 201310742725.3, filed on Dec. 27, 2013, and the disclosure of which is incorporated herein in its entirety by reference as a part of the present application.

What is claimed is:

1. A manufacturing method of a complementary thin film transistor drive back-plate, comprising:
   providing a lower semiconductor layer on a base substrate, and forming a P-type semiconductor active layer from the lower semiconductor layer by a first masking process, the P-type semiconductor active layer being formed of polycrystalline silicon semiconductor;
   providing a gate insulating layer above the lower semiconductor layer to cover the lower semiconductor layer;
   providing a lower electrode layer above the gate insulating layer, and forming a P-type transistor gate electrode, an N-type transistor source electrode and an N-type transistor drain electrode from the lower electrode layer by a second masking process, the P-type transistor gate electrode, the N-type transistor source electrode and the N-type transistor drain electrode being formed of a same metal material, and the P-type transistor gate electrode lying over the P-type semiconductor active layer;
   doping the P-type semiconductor active layer by an implantation process using the P-type transistor gate electrodes as a mask;
   providing an upper semiconductor layer above the lower electrode layer, wherein the upper semiconductor layer includes a pixel electrode and an N-type semiconductor active layer, the pixel electrode and the N-type semiconductor active layer are formed in a same layer by a same third masking process, the P-type transistor gate electrode, the pixel electrode, the N-type transistor source electrode, a portion of N-type semiconductor active layer between the N-type transistor source electrode and the N-type transistor drain electrode, and the N-type transistor drain electrode directly contact with the gate insulating layer and are arranged in order, both of the pixel electrode and the N-type semiconductor active layer comprise an oxide semiconductor material on the lower electrode layer, and two ends of the N-type semiconductor active layer overlap and contact the N-type transistor source electrode and the N-type transistor drain electrode, respectively;
   conducting a plasma treatment on the oxide semiconductor material corresponding to the region of the pixel electrode;
   providing an isolation insulating protective layer above the upper semiconductor layer, and forming contact holes and a protection unit from the isolation insulating protective layer by a same fourth masking process, the contact holes lying at two ends of the P-type semiconductor active layer and a region corresponding to the pixel electrode;
   providing an upper electrode layer above the isolation insulating protective layer, and forming a P-type transistor source electrode, a P-type transistor drain electrode and an N-type transistor gate electrode from the upper electrode layer a fifth masking process, the P-type transistor source electrode and the P-type transistor drain electrode being connected to two ends of the P-type semiconductor active layer through the contact holes, respectively, and the N-type transistor gate electrode lying over the N-type semiconductor active layer; and providing a pixel defining layer above the upper electrode layer, and forming the pixel defining layer including a pixel connection opening by a sixth masking process.

2. The manufacturing method of the complementary thin film transistor drive back-plate claimed as claim 1, wherein providing the lower semiconductor layer on the base substrate comprises:

arranging a buffer layer on the base substrate;

arranging an amorphous silicon thin film on the buffer layer; and conducting a dehydrogenating treatment and an excimer laser annealing treatment on the amorphous silicon thin film.

3. The manufacturing method of the complementary thin film transistor drive back-plate claimed as claim 2, wherein providing the lower electrode layer above the gate insulating layer, and forming the P-type transistor gate electrode, the N-type transistor source electrode and the N-type transistor drain electrode from the lower electrode layer by the second marking process and doping the P-type semiconductor active layer by the implantation process using the P-type transistor gate electrodes as a mask comprises:

forming a plurality of the P-type semiconductor active layers from the lower semiconductor layer; the P-type semiconductor active layer including a source contact region, a drain contact region and an active-layer linkage region disposed between the source contact region and the drain contact region;

performing a dopant implantation on the P-type semiconductor active layers, so as to implant dopants into the source contact region and the drain contact region, respectively; and activating the dopants.

4. The manufacturing method of the complementary thin film transistor drive back-plate claimed as claim 3, wherein, the contact holes are located on two sides of the P-type transistor gate electrode, and penetrate the isolation insulating protective layer up to the source contact region and the drain contact region of the P-type semiconductor active layer; and the pixel connection opening is disposed on the pixel electrode.

5. The manufacturing method of the complementary thin film transistor drive back-plate claimed as claim 1, wherein, the P-type transistor drain electrode is connected to the pixel electrode; and the N-type semiconductor active layer is connected between the N-type transistor source electrode and the N-type transistor drain electrode.

6. The manufacturing method of the complementary thin film transistor drive back-plate claimed as claim 1, wherein, the upper semiconductor layer is made of any one selected from the group consisting of indium gallium zinc oxide, zinc oxide, indium zinc oxide, and indium tin zinc oxide or a composite of several materials selected from them as desire.

* * * * *